US006437398B2

United States Patent
Widdershoven

(10) Patent No.: US 6,437,398 B2
(45) Date of Patent: Aug. 20, 2002

(54) ONE-TIME UV-PROGRAMMABLE NON-VOLATILE SEMICONDUCTOR MEMORY AND METHOD OF PROGRAMMING SUCH A SEMICONDUCTOR MEMORY

(75) Inventor: Franciscus Petrus Widdershoven, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/846,599

(22) Filed: Apr. 30, 2001

(30) Foreign Application Priority Data

May 1, 2000 (EP) .......................................... 00201555

(51) Int. Cl.⁷ .......................................... H01L 29/788
(52) U.S. Cl. ...................... 257/323; 257/290; 257/316; 257/431; 365/185.32
(58) Field of Search ................................ 257/323, 290, 257/317, 431; 438/105; 365/185.32, 108, 149

(56) References Cited

U.S. PATENT DOCUMENTS 5,579,199 A * 11/1996 Kawamura et al. ......... 365/108
5,886,368 A * 3/1999 Forbes et al. .................. 257/77
6,309,907 B1 * 10/2001 Forbes et al. ............... 438/105
6,313,502 B1 * 11/2001 Widdershoven ............. 257/323

FOREIGN PATENT DOCUMENTS

DE 2912859 A1 10/1980

* cited by examiner

Primary Examiner—David Nelms
Assistant Examiner—Tu-Tu Ho
(74) Attorney, Agent, or Firm—Aaron Waxler

(57) ABSTRACT

One-time UV-programmable read-only memory (1) comprising a number of memory cells in the form of MOS transistors (T) which are arranged in a matrix of rows and columns, each transistor comprising a source and a drain zone (12) and a channel zone (13) formed in a surface zone (11) of a semiconductor substrate (10). Said semiconductor zones adjoin a surface (14) of the semiconductor substrate on which surface a layer structure (17) is formed comprising floating gates (16) and control gates (15). The layer structure is provided with windows (18) through which UV radiation can reach the edges of the floating gates. The memory is further provided with means for generating an electric voltage between the substrate (10) and the control gates (16) during programming the memory by means of UV radiation. Thus, the memory can be programmed without being externally contacted during programming.

10 Claims, 6 Drawing Sheets

ONE-TIME UV-PROGRAMMABLE NON-VOLATILE SEMICONDUCTOR MEMORY AND METHOD OF PROGRAMMING SUCH A SEMICONDUCTOR MEMORY

BACKGROUND OF THE INVENTION

The invention relates to a one-time UV-programmable non-volatile semiconductor memory comprising a number of MOS transistors, which are arranged in a matrix of rows and columns and which serve as memory cells, which MOS transistors include source, drain and channel regions, which are formed in a surface zone of a semiconductor substrate and which adjoin a surface of said semiconductor substrate, which MOS transistors further include floating gates and control gates, which are formed in a layer structure extending on the surface, which layer structure is provided with windows allowing UV radiation to penetrate almost to the floating gates.

Between the channel region and the floating gate, a potential barrier is formed by a layer of a gate oxide, between the floating gate and the control gate a potential barrier is formed by a dielectric which is composed of, for example, a layer of silicon nitride enclosed between two layers of silicon oxide. By exposing charge carriers, which are present near these potential barriers, to UV radiation, these charge carriers can be excited and attain such a high energy level that they are capable of passing these potential barriers. If no electric voltage is applied between the substrate and the control gate during such a radiation process, then any charge present on the floating gate will flow away to the substrate or the control gate. The floating gate will then be discharged. If an electric voltage is applied between the substrate and the control gate during such a radiation process, then electrically charging the floating gate will be possible. By charging the floating gates of a part of the transistors, the memory is programmed. The transistors with a charge on the floating gates exhibit a different threshold voltage than the transistors without a charge on the floating gates. If a voltage that ranges between these threshold voltages is applied to the control gates via word lines, then electric current can flow through transistors having a low threshold voltage, but not through transistors having a high threshold voltage. This is checked by applying a suitable voltage between the source and drain regions via bit lines.

After the pattern of charges has been provided on the floating gates, the semiconductor memory thus programmed is subjected to a "final assembly" process, i.e. provided with a customary airtight envelope of a black synthetic resin with pins or strips for external contact. The information stored in the semiconductor memory in the form of charges can be read many times, but it cannot be changed. Such semiconductor memories, also referred to as OTP-ROMs (One-Time Programmable Read Only Memory) can also be used in computers for storing, for example, computer programs, printer fonts or games, but they can also be used, for example, in smart cards.

DE-A-29 12 859 discloses a semiconductor memory of the type mentioned in the opening paragraph, in which, at the location of the floating gates, the UV radiation-transmitting windows are provided in the control gates. The charge carriers present near the dielectric between the floating gate and the control gate, can be excited by exposure to radiation and, as a result thereof, attain such a high energy level that they can pass the potential barrier formed by this dielectric.

The semiconductor memory can be programmed by first providing all floating gates with a charge. In this process, all transistors are simultaneously irradiated, while a voltage is applied between the substrate and the control gates. Subsequently, a part of the floating gates is electrically discharged in accordance with a pattern to be programmed, whereby use is made of, for example, the Fowler-Nordheim tunnel effect. The semiconductor memory can alternatively be programmed by first discharging all floating gates as described above and, subsequently, individually and successively exposing a part of the memory cells, in accordance with the pattern to be programmed, by means of, for example, an UV laser beam, while said voltage is applied between the substrate and the control gates.

In order to program the known semiconductor memory, suitable voltages must be applied between the substrate and the control gates of the individual transistors to electrically discharge the floating gates. For this purpose, electronic circuits must be provided on the semiconductor substrate which, after programming, are no longer necessary, and bond pads must be provided on the semiconductor substrate to enable these circuits to be externally contacted during programming. In addition, in order to externally contact these circuits during programming, expensive equipment is necessary which is provided with contact pins which can be pressed onto said bond pads.

Since the UV radiation-transmitting windows of the known semiconductor memory are formed in the control gates, the memory cells of this semiconductor memory must be comparatively large. For example, when use is made of a "0.5 $\mu$m technology", the manufacture of windows having a length and a width of 0.5 $\mu$m requires the control gates and the underlying floating gates to have a length and a width of at least 1 $\mu$m in practice. The known semiconductor memory thus takes up a comparatively large substrate surface area.

SUMMARY OF THE INVENTION

It is an object of the invention to provide, inter alia, a one-time UV-programmable non-volatile semiconductor memory comprising a number of MOS transistors, which are arranged in a matrix of rows and columns and which serve as memory cells, which semiconductor memory, unlike the above-described prior-art memory, can be programmed without the formation of additional electronic circuits on the semiconductor substrate, without providing bond pads on the semiconductor substrate to externally contact the circuits, and without expensive equipment for externally contacting the circuits.

To achieve this, the semiconductor memory mentioned in the opening paragraph is characterized in accordance with the invention in that the semiconductor memory is provided with means for generating, by means of UV radiation, an electric voltage necessary during programming, between the substrate and the control gates. As a result, the semiconductor memory can be readily programmed in two steps. During the first step, the whole surface of the semiconductor memory is exposed to UV radiation, so that, simultaneously, a voltage is generated between the substrate and the control gates, and charge carriers near the floating gates are excited. The floating gates of all transistors are thus provided with a charge. During the second step, the means for generating an electric voltage between the substrate and the control gates by means of UV radiation are not irradiated and, hence, without a voltage between the substrate and the control gates, a part of the memory cells are individually irradiated in accordance with the pattern to be programmed. The charge on the floating gates of these irradiated transistors is thus removed again. In this manner, the semiconductor memory is programmed without an external voltage being required. The radiation process can be carried out, for example, by successively exposing the memory cells to radiation originating from an UV laser beam. Alternatively, use can be made of an optical projector, such as a so-called "stepper" which is customarily used in the semiconductor technology, which optical projector is used to image a mask which corresponds to the pattern to be programmed.

The radiation process during the second step can be carried out by means of much simpler radiation equipment if for the patterned irradiation of a part of the memory cells a mask is formed on the surface, during this second step, which is provided with UV-transmitting windows only at the location of these memory cells to be programmed, after which the entire surface is irradiated by, for example, an UV lamp. Consequently, the means for generating an electric voltage between the substrate and the control gates are shielded by the mask during the radiation process. For reasons of security, the mask is preferably removed after the radiation process. It is thus precluded that the contents of the memory can be retrieved in case of disassembly.

In a first example, the means for generating said voltage by means of UV radiation comprise, for each row of transistors, an UV radiation-accessible photodiode having a semiconductor zone, which is formed in the surface zone, and which is of an opposite conductivity type with respect to the surface zone which is connected, by means of a word line, to the control gates of all transistors in the row. To integrate these photodiodes, comparatively little space on the semiconductor substrate is required.

In another example, the means used to generate said photovoltage comprise an electronic circuit, which is fed by UV radiation-accessible photodiodes formed in the surface zone, which circuit is used to apply a voltage to the control gates of all transistors upon irradiation of the photodiodes, and said circuit being decoupled from the rows of transistors by connecting a supply voltage to the memory. Consequently, when the memory is used, said electronic circuit is decoupled from the rows of transistors.

Preferably, the UV radiation-transmitting windows in the layer structure are arranged so that the gate oxide at the edge of the floating gates is accessible to UV radiation. This enables charge carriers situated near the gate oxide to be excited and provided with so much energy that they are capable of passing the potential barrier formed by the gate oxide. As will become apparent, such windows can be readily formed next to the control gate and the floating gate.

Preferably, the windows are provided with a coating, at the location where the wall of the windows intersects the dielectric between the floating gate and the control gate, which coating is substantially opaque to UV radiation. In this manner, it is achieved that only charge carriers present near the gate oxide can be excited by the UV radiation, while the charge carriers present near the dielectric between the floating gate and the control gate cannot be excited by the UV radiation. It is thus precluded that in the course of a radiation process, whereby a voltage is applied between the substrate and the control gates, charge carriers reaching the floating gate through the gate oxide subsequently leave the floating gate again through the dielectric between the floating gate and the control gate. In this manner, the floating gate can be more efficiently provided with a charge.

In a semiconductor memory comprising very compact memory cells, the surface zone of the semiconductor substrate is provided with adjacent strip-shaped semiconductor zones of, alternately, the first and the second conductivity type, which strip-shaped semiconductor zones adjoin the surface of the semiconductor substrate, and the surface is provided with a layer structure of paths of an insulating material and strip-shaped conductors which are alternately arranged in a side-by-side relationship and extend transversely to the semiconductor zones, floating gates being situated underneath the layer structure, which floating gates are arranged on the crossover points of the strip-shaped semiconductor zones of the first conductivity type and the strip-shaped conductors, which semiconductor zones of the first conductivity type form channel regions under the floating gates, which semiconductor zones of the second conductivity type form bit lines as well as common source and drain regions on either side of the channel regions, and which strip-shaped conductors form both word lines and control gates which are situated above the channel regions, and the UV radiation-transmitting windows being formed on the crossover points of the strip-shaped semiconductor zones of the first conductivity type and the paths of insulating material, the gate oxide at the edge of the floating gates being UV radiation-accessible through said windows. These windows can be readily manufactured so as to be self-aligned with minimum dimensions.

Preferably, the strip-shaped conductors and the underlying floating gates are provided with a layer which is substantially opaque to UV radiation on the sides where they intersect the dielectric between the floating gate and the control gate. The windows are thus readily provided with the above-mentioned coating which is substantially opaque to UV radiation.

When use is made of a "0.5 $\mu$m technology", a memory cell of such a semiconductor memory can be formed on a surface of only 1 $\mu m^2$. The strip-shaped semiconductor zones as well as the paths of insulating material and conductor tracks formed at right angles thereto then have a width of 0.5 $\mu$m. If, in this semiconductor memory, windows having minimum dimensions, i.e. a length and a width of 0.5 $\mu$m, would be formed in the control gates, as is the case in the above-described prior-art memory, then the strip-shaped semiconductor zones of the first conductivity type and the conductor tracks arranged transversely thereto had to have a width of approximately 1 $\mu$m. This would result in the memory cell having a length and a width of 1.5 $\mu$m and hence a surface area of 2.25 $\mu m^2$.

These and other aspects of the invention will be apparent from and elucidated with reference to the embodiment(s) described hereinafter.

DESCRIPTION OF THE PREFERRED EMBODIMENTS

Figure 1:
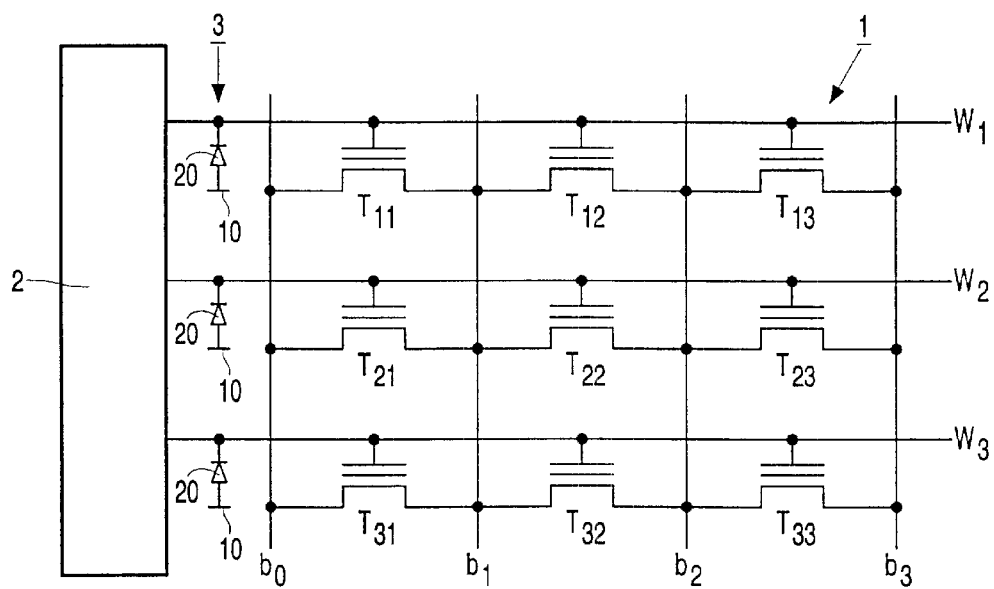
FIG. 1 shows an electrical circuit diagram of a semiconductor memory in accordance with the invention.

FIG. 1 shows an electrical circuit diagram of a one-time UV programmable non-volatile semiconductor memory 1 in accordance with the invention. The Figure shows a number of MOS transistors $T_{11}, \ldots, T_{ij} \ldots, T_{33}$, which are arranged in a matrix of three rows and three columns and which serve as memory cells. In the example, the transistors $T_{ij}$ are of the n-channel type, with n-type doped source and drain regions which are formed in a p-type doped surface zone of a semiconductor substrate. It will be clear that, in practice, the matrix and the number of transistors are many times larger. The semiconductor memory 1 comprises a system of word lines $w_1$, $w_2$ and $W_3$ and bit lines $b_0$, $b_1$, $b_2$ and $b_3$. The word line $w_1$ is connected to the control gates of the row of transistors $T_{11}$, $T_{12}$ and $T_{13}$, the word line $w_2$ is connected to the transistors $T_{21}$, $T_{22}$ and $T_{23}$, etc. The bit line $b_0$ is connected to the source regions of the column of transistors $T_{11}$, $T_{21}$, and $T_{31}$, the bit line $b_1$ is connected to the drain regions of the column of the same transistors $T_{11}$, $T_{21}$ and $T_{31}$ and to the source regions of the column of transistors $T_{12}$, $T_{22}$ and $T_{32}$, etc. The bit lines b are also connected to a decoder and a read circuit, which are not shown. The word lines w are connected to a decoder circuit 2.

The transistors $T_{ij}$ are provided with floating gates on which a charge can be provided. A transistor comprising a floating gate on which a charge is provided exhibits a threshold voltage which differs from that of a transistor with an uncharged floating gate. If a positive charge is provided, then the threshold voltage may be, for example, 1.3 volt in the case of an n-channel transistor described herein, while the threshold voltage of an uncharged floating gate is, for example, 1.9 volt. If a voltage ranging between these threshold voltages, such as for example 1.6 volt, is applied to the control gates via the word lines, then an electric current can flow through transistors with a low threshold voltage but not through transistors with a high threshold voltage.

To find out whether, for example, the transistor $T_{32}$ has a low threshold voltage, or not, said positive voltage of 1.6 volt is applied to the word line w, and all bit lines "to the left" of this transistor, i.e. the bit lines $b_0$ and $b_1$ are grounded, whereas a positive voltage is applied to all bit lines "to the right" of the transistor, i.e. the bit lines $b_2$ and $b_3$. If the transistor $T_{32}$ has a low threshold voltage, then a current will start flowing, however, if this transistor has a high threshold voltage, then there will be not current flow. By successfully grounding the bit lines "towards the right", i.e. in succession $b_0$, $b_0$ and $b_1$, $b_0$ and $b_1$ and $b_2$, while the positive voltage is applied to the other bit lines, a whole word can be read. By repeating this operation for each word line, the contents of the memory can be read.

After a pattern of charges has been provided on the floating gates, the semiconductor memory thus programmed is subjected to a "final assembly" operation, i.e. it is provided with a customary airtight envelope of a black synthetic resin with pins or strips for enabling external contact. The contents of the memory can be read many times, but the information cannot be changed.

Figure 2:
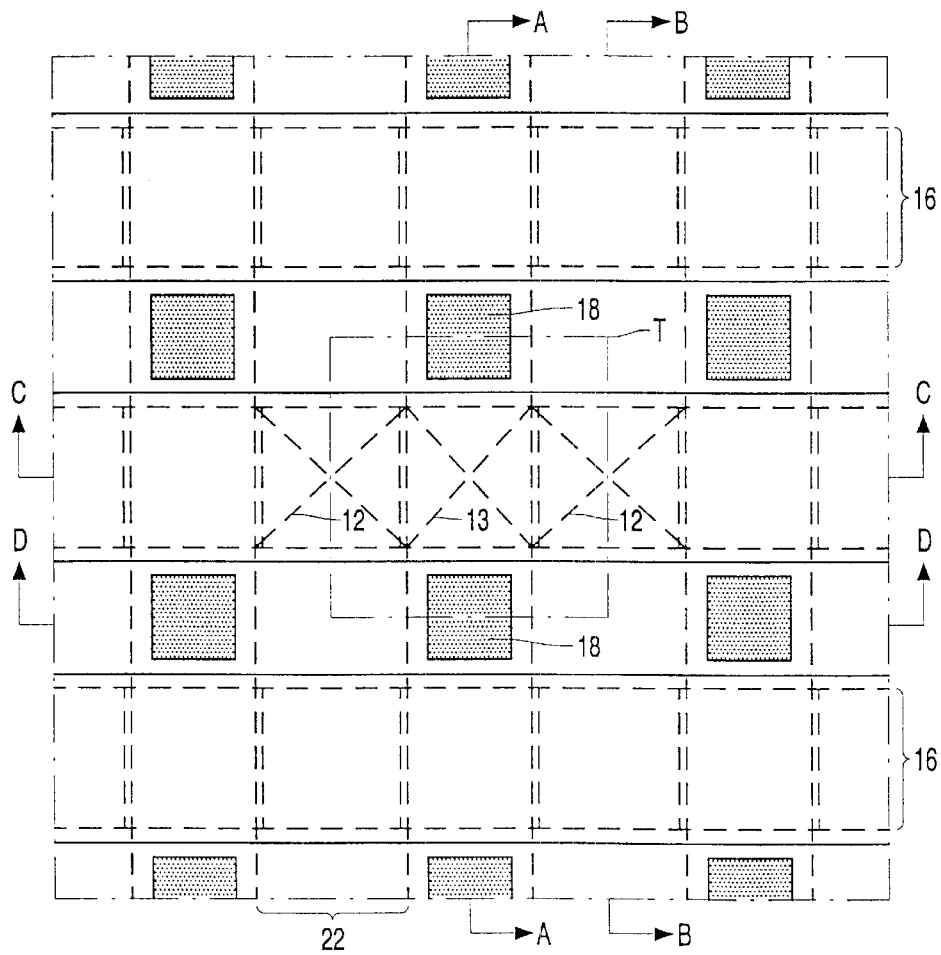
FIG. 2 is a diagrammatic plan view of a preferred embodiment of a semiconductor memory in accordance with the invention.
Figure 3:
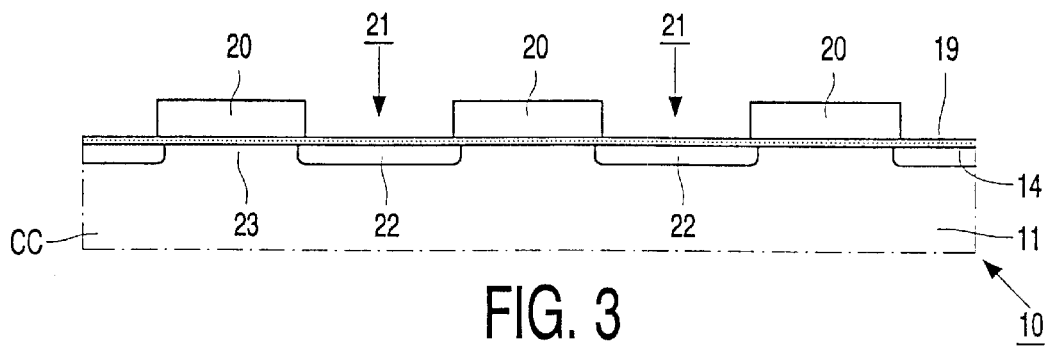
FIGS. 3 through 14 are diagrammatic, cross-sectional views of a few stages in the manufacture of the semiconductor memory shown in FIG. 2, and FIGS. 15 through 20 are diagrammatic, cross-sectional views of a few stages in the manufacture of a photodiode to be used in the memory.

FIG. 2 diagrammatically shows a plan view, and FIGS. 9, 11, 12 and 13 diagrammatically show several cross-sectional views of a preferred embodiment of a semiconductor memory in accordance with the invention, which cross-sectional views bear references AA, BB, CC and DD which refer to surfaces A—A, B—B, C—C and D—D indicated in FIG. 2.

These Figures show a semiconductor memory comprising a number of MOS transistors T, which are arranged in a matrix of rows and columns and serve as memory cells, and which comprise source and drain regions 12 and channel regions 13 which form part of a surface zone 11 of a semiconductor substrate 10. The semiconductor regions 12 and 13 adjoin a surface 14 of the semiconductor substrate 10. The transistors T are further provided with floating gates 15 and control gates 16, which are formed in a layer structure 17 extending on the surface 14. The layer structure 17 is provided with UV radiation-transmitting windows 18, which are arranged so that the gate oxide at the edge of the floating gates is accessible to UV radiation.

Through the windows 18, the gate oxide 19 near the floating gate 15 can be irradiated. The silicon oxide layer 31 situated in the bottom part of the windows guides the UV radiation to the gate oxide 19 situated underneath the floating gate 15. Charge carriers present at said location can be excited by this radiation and become energized to such a degree that they are capable of passing the potential barrier formed by the gate oxide 19. If, in addition, an electric voltage is present between the substrate 10 and the control gate 16, then the floating gate 15 may become electrically charged. The floating gates are discharged again by carrying out an irradiation operation without an electric voltage between the substrate 10 and the control gate 15. By making use of this, a charge can be provided on the floating gates 15 of a part of the transistors.

The windows 18 are provided with a coating 32, at the location where the wall of the windows intersects the dielectric 26 between the floating gate 15 and the control gate 16, which coating is substantially opaque to UV radiation. In this manner, it is achieved that only charge carriers situated near the gate oxide 19 can be excited by the UV radiation, while the charge carriers situated near the dielectric 26 between the floating gate 15 and the control gate 16 cannot be excited. As a result, it is counteracted that during a radiation operation in which a voltage is applied between the substrate 10 and control gates 16, charge carriers reaching the floating gate 16 through the gate oxide 19 can subsequently leave the floating gate again through the dielectric 26.

The semiconductor memory is further provided with means 3 for generating, by means of UV radiation, an electric voltage between the substrate 10 and the control gates 16, which voltage is necessary for programming. This enables the semiconductor memory to be readily programmed in two steps. During the first step, the whole surface of the semiconductor memory is exposed to UV radiation, so that during irradiation a voltage is generated between the substrate 10 and the control gates 16. The floating gates 15 of all transistors T are thus provided with a charge. As a result, the threshold voltage of all transistors becomes 1.3 volt in this example. During the second step, the means 3 for generating an electric voltage by means of UV radiation are not irradiated and hence a part of the memory cells is individually irradiated in accordance with the pattern to be programmed without a voltage being generated between the substrate 10 and the control gates 16. Said irradiation can be carried out, for example, by successively irradiating the memory cells by means of an UV laser beam. This can alternatively be achieved by imaging a mask corresponding to the pattern to be programmed by means of an optical projector, such as a "stepper" which is customarily used in the semiconductor technology. The charge on the floating gates 15 of these irradiated transistors is thus removed again. As a result, the threshold voltage of the individually irradiated transistors becomes 1.9 volt. In this manner, the semiconductor memory is programmed without an external voltage being necessary.

The irradiation process during the second step can be carried out by means of much simpler radiation equipment if a photoresist mask, not shown in the Figures, of a material which does not transmit UV radiation is formed to irradiate, in accordance with a pattern, a part of the memory cells during this second step, said photoresist mask being provided with UV-transmitting windows at the location of these transistors $T_{ij}$ to be programmed, whereafter the entire surface can be irradiated with a relatively inexpensive UV lamp. For reasons of security, the mask is preferably removed after the irradiation process. It is thus precluded that the contents of the memory can be retrieved in case of disassembly.

Figure 14:
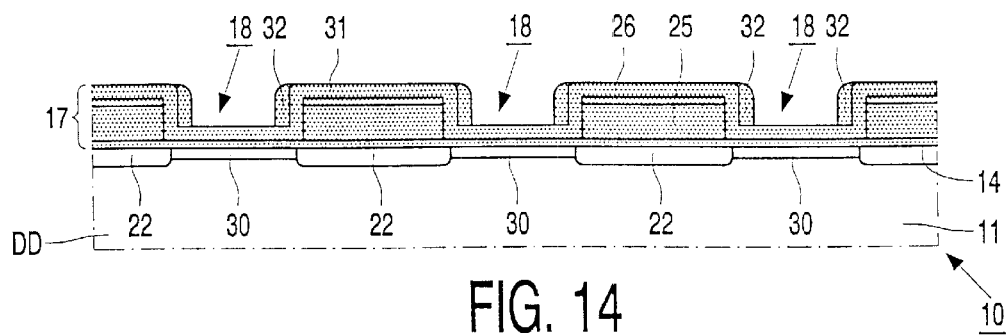

In a first example, the means for generating said voltage by means of UV radiation, as shown in FIG. 1 and, in section in FIG. 14, comprise an UV radiation-accessible photodiode 40 for each row of transistors. The photodiodes 40 comprise a semiconductor zone 41, which is formed in the surface zone 11 and the conductivity type of which is opposite to that of said surface zone 11. The semiconductor zone 41 is connected to the control gates 16 by a metal track 42.

In another example, not shown, the means for generating said photovoltage comprise an electronic circuit, which is fed by UV radiation-accessible photodiodes formed in the surface zone, by means of which circuit a voltage is applied to all rows of transistors upon irradiation of the photodiodes, and said circuit being decoupled from the rows of transistors by applying a supply voltage to the memory. In other words, when the memory is used, said electronic circuit is decoupled from the rows of transistors.

FIGS. 3 through 13 are diagrammatic, cross-sectional views of a few stages in the manufacture of the above-described semiconductor memory. There is started from a semiconductor substrate 10 whose surface zone 11 is p-type doped with approximately $10^{17}$ boron atoms per cc. First, the surface 14 of the surface zone 11 is customarily provided with an approximately 10 nm thick layer of a gate oxide 19. This gate-oxide layer is provided with an approximately 250 nm thick layer of polycrystalline silicon which is n-type doped with approximately $2.10^{19}$ atoms per cc, in which polycrystalline-silicon layer a pattern of 0.5 $\mu$m wide strips 20 is customarily formed, which strips are mutually separated by 0.5 $\mu$m wide trenches 21 wherein the gate oxide 19 is exposed. By means of ion implantation, using the strips 20 as a mask, and a subsequent heat treatment, the strip-shaped semiconductor zones 22 are formed which are n-type doped with approximately $3.10^{20}$ arsenic atoms per cc, said semiconductor zones being mutually separated by strip-shaped semiconductor zones 23 which form part of the surface zone 11.

Figure 4:
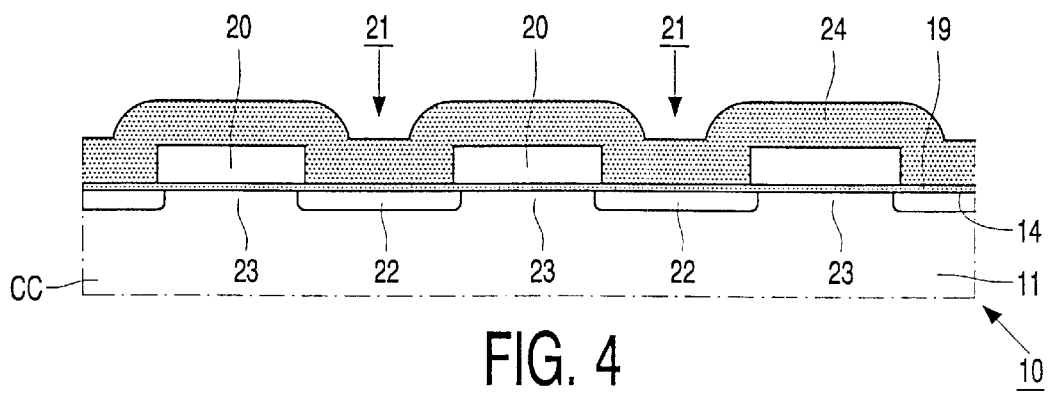
Figure 5:
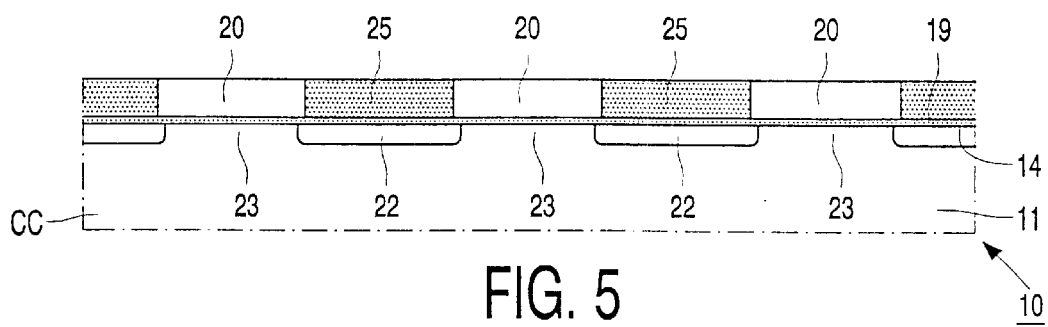

As shown in FIG. 4, a thick layer of silicon oxide 24 is deposited thereon and subsequently subjected to a chemical-mechanical polishing treatment, which is continued until the upper side of the strips 20 is exposed. The trenches 21 between the strips 20 are thus filled with silicon oxide 25.

The polished surface is subsequently provided with a layer 26 of a customary dielectric for this type of semiconductor memories, in this example an approximately 7 nm thick layer of silicon nitride which is enclosed between two approximately 7 nm thick layers of silicon oxide. A polycrystalline layer 27 doped with approximately $2.10^{19}$ arsenic atoms per cc is formed on the layer 26.

Figure 6:
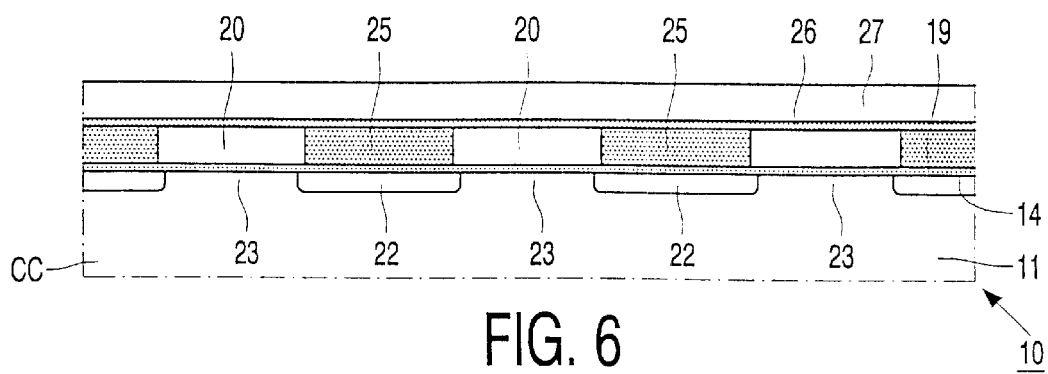
Figure 7:
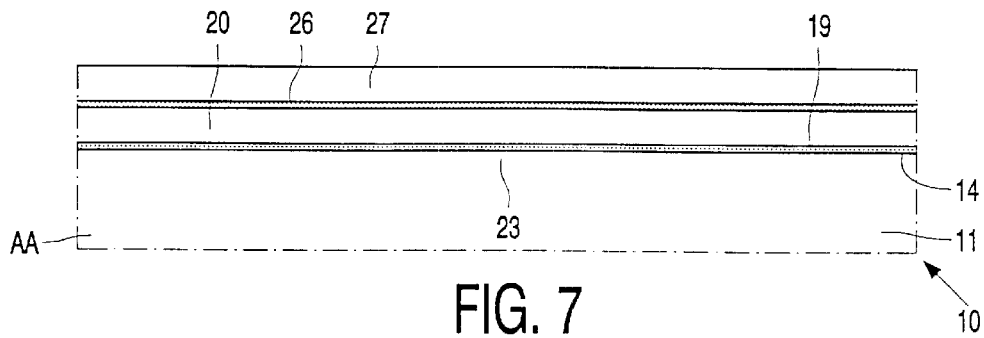
Figure 8:
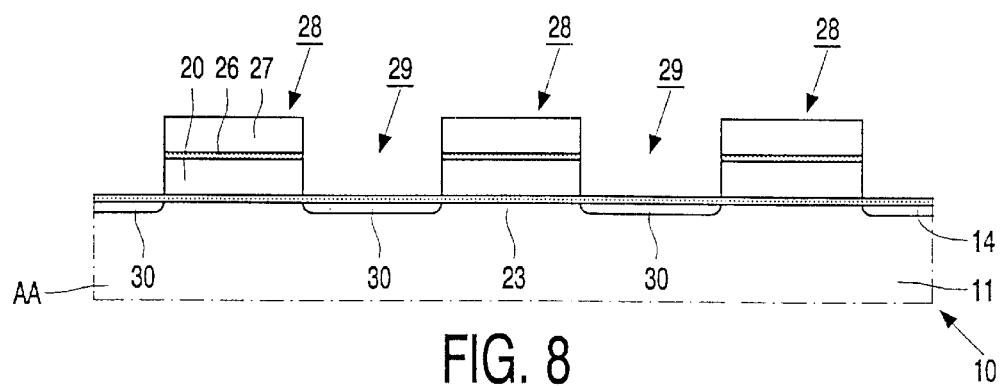
Figure 9:
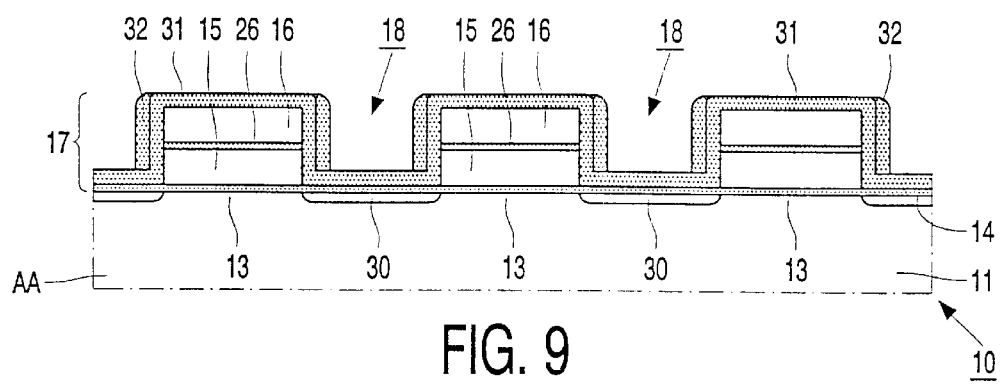
Figure 10:
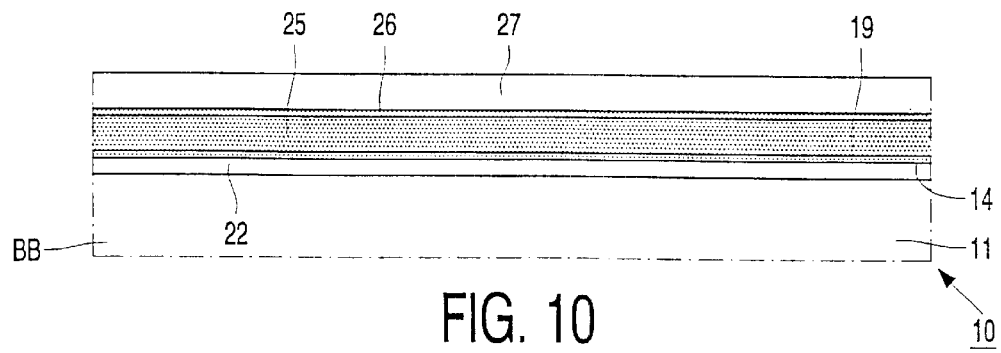
Figure 11:
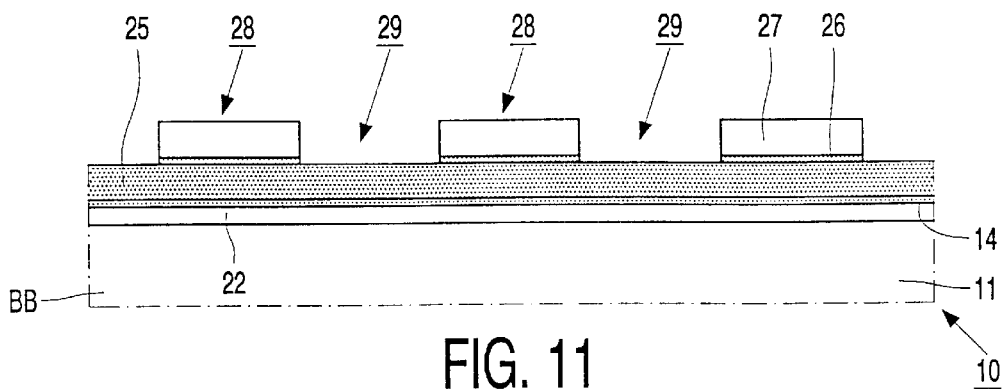
Figure 12:
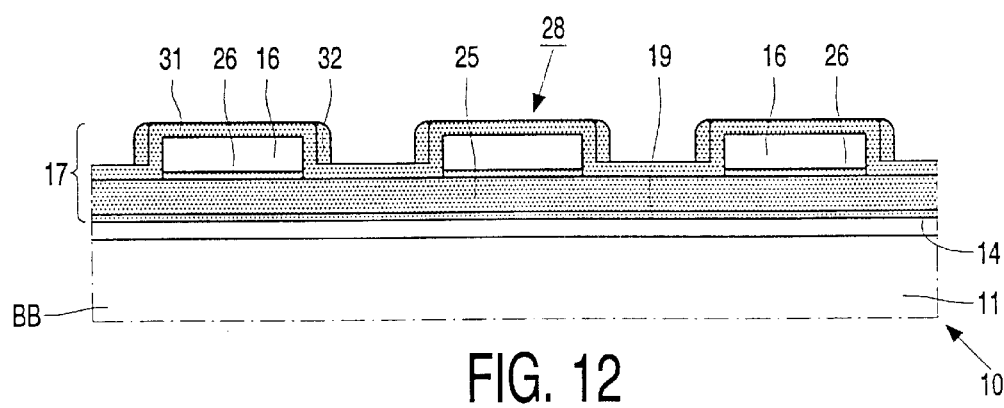
Figure 13:
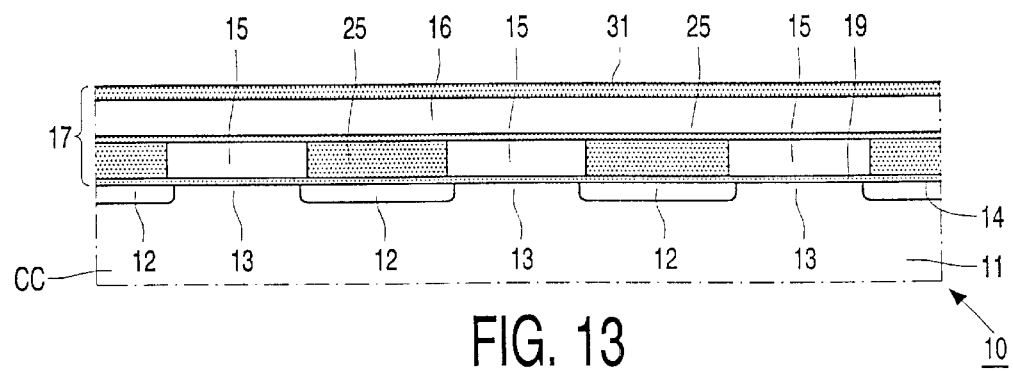

FIG. 7 is a cross-sectional view, at right angles to the sectional view shown in FIG. 6, of a p-type semiconductor zone 23; FIG. 10 is a cross-sectional view, also at right angles to the sectional view shown in FIG. 6, of the n-type semiconductor zone 22. The layer 27 is provided with a strip-shaped photoresist mask, which is not shown, after which the layers of polycrystalline silicon 20 and 27, and the dielectric layer 26 are etched in accordance with a pattern. The etch process stops when the silicon oxide is reached. FIG. 8 shows that in the cross-section of the p-type semiconductor zone 23, 0.5 $\mu$m wide strips 28 are formed which are separated from each other by 0.5 $\mu$m wide trenches 29. In the trenches, the gate oxide 19 is exposed. FIG. 11 shows that, in the cross-section of the n-type semiconductor region 22, the 0.5 $\mu$m wide strips 28 are formed in the dielectric layer 26 and the polycrystalline silicon layer 27. In this case, the silicon oxide strip 25 is exposed.

Subsequently, by means of ion implantation, using the strips 28 and the exposed strips 25 between said strips 28 as a mask, and a thermal treatment, channel-stopper zones 30 are formed which are p-type doped with approximately $10^{18}$ atoms per cc. The whole is subsequently covered with an approximately 70 nm thick layer of silicon oxide 31. Finally, the walls of the strips are provided with an approximately 50 nm thick coating 32 of silicon-rich silicon nitride, which is present on the layer of silicon oxide 31. For this purpose, a layer of such a material is deposited and subsequently subjected to anisotropic etching until the layer of silicon oxide 31 above the strips 28 is exposed again. FIG. 2 shows a plan view of the memory cells thus formed.

In this manner, a semiconductor memory with very compact memory cells T is formed, the surface zone 11 of the semiconductor substrate 10 being provided with adjoining strip-shaped semiconductor zones 23 of the first conductivity type and strip-shaped semiconductor zones 22 of the second conductivity type, said strip-shaped semiconductor zones bordering on the surface 14 of the semiconductor substrate, and the surface 14 being provided with a layer structure 17 including conductors 27 extending transversely to the semiconductor regions 22, 23 and being mutually isolated by trenches 29, floating gates 15 being situated underneath said conductors and being provided on the crossover points of the strip-shaped semiconductor zones of the first conductivity type 23 and the strip-shaped conductors 27. The semiconductor zones of the first conductivity type 23 underneath the floating gates 15 form the channel regions 13 of the transistors. The semiconductor zones of the second conductivity type 22 form bit lines b as well as common source and drain regions 12 situated on either side of the channel regions 13. The strip-shaped conductor tracks 27 form word lines w as well as control gates 16 situated above the channel regions. UV radiation-transmitting windows 18 are formed at the crossover points of the strip-shaped semiconductor zones of the first conductivity type 23 and the trenches 29. Through these windows 18, the strip-shaped semiconductor zones of the first conductivity type 23 next to the channel regions 13 are accessible to UV radiation. When use is made of a "0.5 $\mu$m technology", a memory cell of such a semiconductor memory can be formed on a surface of only 1 $\mu$m$^2$. The strip-shaped semiconductor zones 22 and 23 as well as the conductor tracks 28 and trenches 29 extending at right angles thereto have a width of 0.5 $\mu$m.

Figure 15:
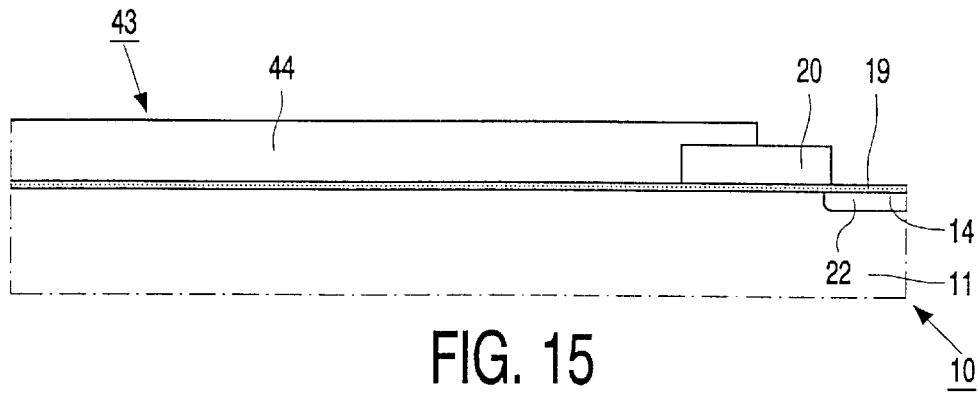
Figure 16:
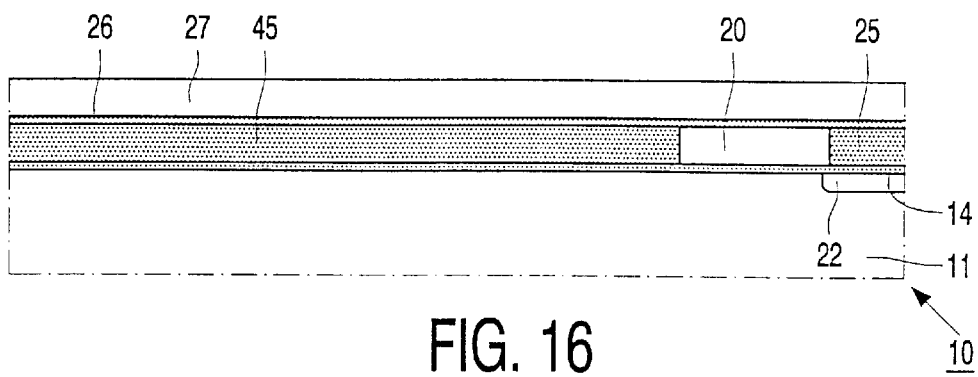
Figure 17:
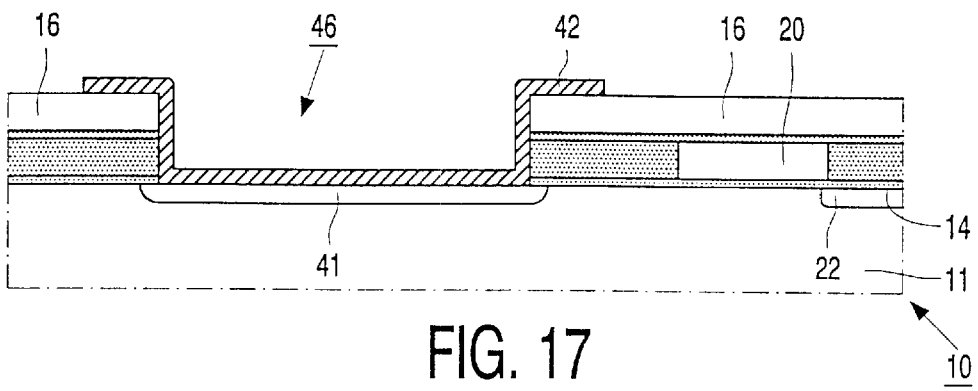
Figure 18:
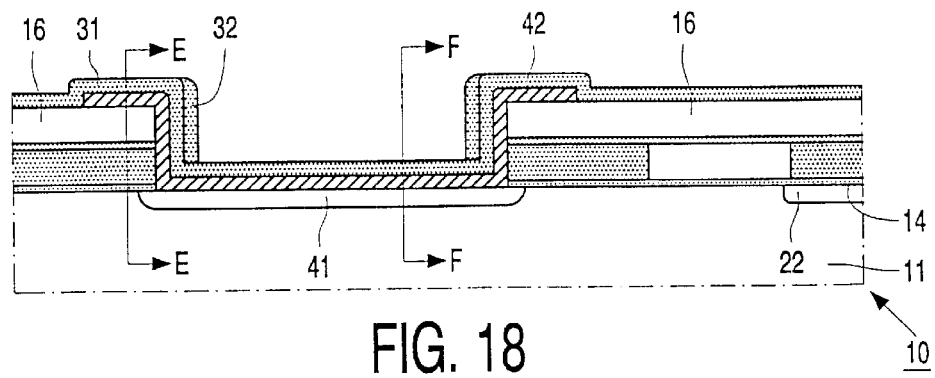
Figure 19:
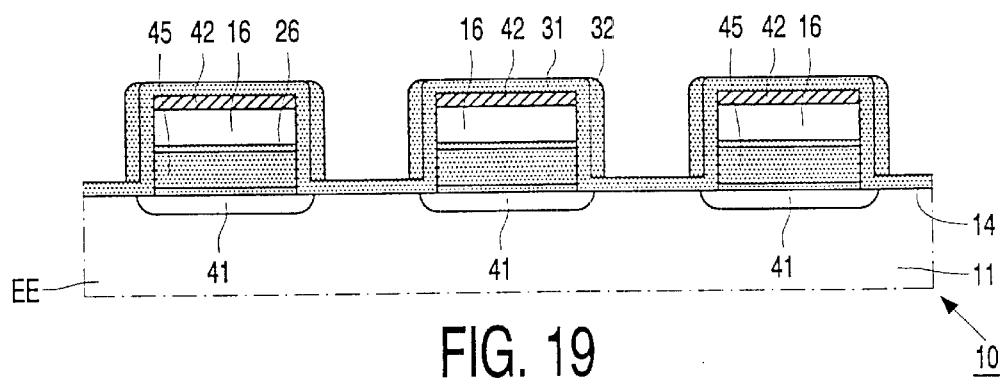
Figure 20:
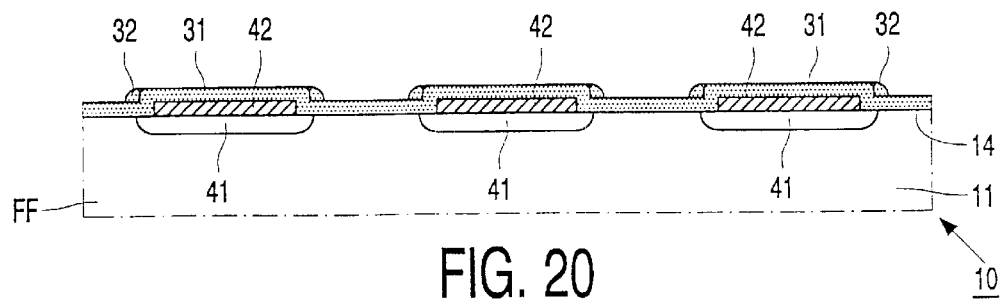

FIGS. 15 through 20 are diagrammatic, cross-sectional views of a few stages in the manufacture of the photodiodes 20. FIG. 15 shows an edge 43 of the substrate 10, which is situated at the structure shown in FIG. 3. At the location of this edge, the layer of polycrystalline silicon wherein the strips 20 are formed is removed during the formation of these strips. During ion implantation to form the strip-shaped n-type zones 22, the edge 43 is covered with a photoresist mask 44. After removal of the photoresist mask 44, the layer of silicon oxide 24 is also deposited on the edge. After this layer 24 has been polished, the edge is covered with a layer of silicon oxide 45. The layer of polycrystalline material 26 and the dielectric 27 are also deposited on the edge. In the layers 45, 26 and 27, a window 46 is formed at the location of the edge, which window extends, in the direction transverse to the plane of the drawing, along the entire memory 1. Within the window 46, the layer of gate oxide 19 is exposed. Subsequently, as shown in FIGS. 8 and 11, the strips 28 and 29 are formed by etching, the control gates or word lines 16 being situated on the layer of silicon oxide 25. The control gates or word lines 16 are interrupted by the window 46. Subsequently, strip-shaped semiconductor zones 41, which are n-type doped with approximately $10^{19}$ atoms per cc, are customarily formed in the window contiguous to the word lines 16. After removal of the gate oxide present in the window, these regions 41 are connected to the word lines 16 interrupted by the window by means of aluminium conductor tracks 47. On the structure thus obtained, the isolating layers 31 and 32 are formed, just like in the memory. As shown in FIG. 20, the surface zone 11 next to the conductor tracks 47 is accessible to UV radiation via the windows 48, so that the desired photovoltage can be generated by UV radiation.

When the above-described, very compact semiconductor memory is programmed, the memory cells are individually irradiated, in the second step, through the windows 18. During this irradiation, each time two transistors situated on either side of the windows 18 are programmed. These two transistors are situated in the same column. Therefore, on the face of it, it seems that only memory cells are available which are composed of two adjoining transistors and a window 18 situated between these transistors, with the cells being separated from each other by a window 18 which must not be used for programming. In this case, a memory cell would have a length of 1 $\mu$m in the direction of the word line and a length of 2 $\mu$m in the direction transverse thereto. As the floating gate of both transistors is either charged or not charged, i.e. both transistors contain the same information, only 50% of the transistors would be used for data. It will be clear, however, that the transistors can also be programmed in a number of other ways. For example, if the memory contains columns with three transistors, as shown in FIG. 1, it is possible to program the floating gates of the transistors $T_{11}$ and $T_{21}$ or the floating gates of the transistors $T_{21}$ and $T_{31}$ or the floating gates of all three transistors or none of the floating gates of the three transistors. In this memory, information can be stored in four different ways. If the memory contains, for example, columns with four transistors, then these four transistors can be programmed in seven different ways by irradiating the windows situated between the transistors. If these four transistors formed two cells, they could be programmed in $2^2=4$ different ways. Consequently, the number of possibilities is much larger in practice. If, however, all the cells could be individually programmed, then it would be possible to program the four cells in $2^4=16$ ways. As is known, the above-described compact memory cannot be programmed in so many ways. It has been found, however, that if this memory contains columns with n transistors, where n>30, the transistors cannot be programmed in $2^n$ ways, but still in $2^{0.81 \cdot n}$ ways. It will be clear that in comparison with, for example, the above described memory comprising transistors provided with windows in the control gates, the use of the above-described very compact memory results in a substantial saving of space on the semiconductor substrate.

What is claimed is:

1. A one-time UV-programmable non-volatile semiconductor memory comprising a number of MOS transistors, which are arranged in a matrix of rows and columns and which serve as memory cells, which MOS transistors include source, drain and channel regions, which are formed in a surface zone of a semiconductor substrate and which adjoin a surface of said semiconductor substrate, which MOS transistors further include floating gates and control gates, which are formed in a layer structure extending on the surface, which layer structure is provided with windows allowing UV radiation to penetrate almost to the floating gates, characterized in that the semiconductor memory is provided with means for generating, by means of UV radiation, an electric voltage necessary during programming, between the substrate and the control gates.

2. A semiconductor memory as claimed in claim 1, characterized in that the means for generating said voltage by means of UV radiation comprise, for each row of transistors, an UV radiation-accessible photodiode having a semiconductor zone, which is formed in the surface zone, and which is of an opposite conductivity type with respect to the surface zone which is connected, by means of a word line, to the control gates of all transistors in the row.

3. A semiconductor memory as claimed in claim 1, characterized in that the means used to generate said photovoltage comprise an electronic circuit, which is fed by UV radiation-accessible photodiodes formed in the surface zone, which circuit is used to apply a voltage to the control gates of all transistors upon irradiation of the photodiodes, and said circuit being decoupled from the rows of transistors by connecting a supply voltage to the memory.

4. A semiconductor memory as claimed in claim 1, characterized in that UV radiation-transmitting window in the layer structure are arranged so that the gate oxide at the edge of the floating gates is accessible to UV radiation.

5. A semiconductor memory as claimed in claim 4, characterized in that the windows are provided with a coating, at the location where the wall of the windows intersects the dielectric between the floating gate and the control gate, which coating is substantially opaque to UV radiation.

6. A semiconductor memory as claimed in claim 4, characterized in that the surface zone of the semiconductor substrate is provided with adjacent strip-shaped semiconductor zones of, alternately, the first and the second conductivity type, which strip-shaped semiconductor zones adjoin the surface of the semiconductor substrate, and the surface is provided with a layer structure of paths of an insulating material and strip-shaped conductors which are alternately arranged in a side-by-side relationship and extend transversely to the semiconductor zones, floating gates being situated underneath the layer structure, which floating gates are arranged on the cross-over points of the strip-shaped semiconductor zones of the first conductivity type and the strip-shaped conductors, which semiconductor zones of the first conductivity type form channel regions under the floating gates, which semiconductors of the second conductivity type form bit lines as well as common source and drain regions on either side of the channel regions, and which strip-shaped conductors form both word lines and control gates situated above the channel regions, and the UV radiation-transmitting windows being formed on the cross-over points of the strip-shaped semiconductor zones of the first conductivity type and the paths of insulating material, the gate oxide at the edge of the floating gates being UV radiation-accessible through said windows.

7. A semiconductor memory as claimed in claim 6, characterized in that the strip-shaped conductors and the underlying floating gates are provided with a layer which substantially does not transmit UV radiation on the side where they intersect the dielectric between the floating gate and the control gate.

8. A method of programming the semiconductor memory as claimed in claim 1, characterized in that, in a first step, the entire surface of the semiconductor memory is exposed to UV radiation, so that, simultaneously, a voltage is generated between the substrate and the control gates, and charge carriers near the floating gates are excited, in which first step, the floating gates of all transistors are provided with a charge, after which, in a second step, the means for generating an electric voltage between the substrate and the control gates by means of UV radiation are not irradiated and, without a voltage between the substrate and the control gates, a part of the memory cells are individually irradiated in accordance with the pattern to be programmed, in which second step, the charge on the floating gates of these irradiated transistors is removed again.

9. A method of programming the semiconductor memory as claimed in claim 8, characterized in that, in order to irradiate, in accordance with a pattern, a part of the memory cells, a mask is formed on the surface during the second step, which mask is provided with UV-transmitting windows only at the location of these memory cells to be programmed, after which the entire surface is irradiated.

10. A method of programming the semiconductor memory as claimed in claim 9, characterized in that after the memory cells have been irradiated in accordance with a pattern, the mask is removed again.

* * * * *